US007256668B2

(12) United States Patent
Wyeth et al.

(10) Patent No.: US 7,256,668 B2
(45) Date of Patent: Aug. 14, 2007

(54) PHASE CHANGE CONTROL DEVICES AND CIRCUITS FOR GUIDING ELECTROMAGNETIC WAVES EMPLOYING PHASE CHANGE CONTROL DEVICES

(75) Inventors: N. Convers Wyeth, Oakton, VA (US); Albert M. Green, Springfield, VA (US)

(73) Assignee: Science Applications International Corporation, San Diego, CA (US)

( * ) Notice: Subject to any disclaimer, the term of this patent is extended or adjusted under 35 U.S.C. 154(b) by 0 days.

(21) Appl. No.: 11/376,341

(22) Filed: Mar. 16, 2006

(65) Prior Publication Data

US 2006/0238277 A1 Oct. 26, 2006

Related U.S. Application Data

(63) Continuation of application No. 11/246,233, filed on Oct. 11, 2005, now Pat. No. 7,046,106, which is a continuation of application No. 10/980,601, filed on Nov. 4, 2004, now Pat. No. 6,956,451, which is a continuation of application No. 10/346,551, filed on Jan. 17, 2003, now Pat. No. 6,828,884, which is a continuation-in-part of application No. 09/851,619, filed on May 9, 2001, now Pat. No. 6,730,928.

(51) Int. Cl.
*H01P 1/10* (2006.01)
*H01L 29/02* (2006.01)

(52) U.S. Cl. .......................... 333/262; 333/101; 257/3

(58) Field of Classification Search ................ 333/101, 333/103, 262; 257/3
See application file for complete search history.

(56) References Cited

U.S. PATENT DOCUMENTS

| | | | | |
|---|---|---|---|---|
| 3,530,441 | A | 9/1970 | Ovshinsky | 365/113 |
| 3,918,032 | A | 11/1975 | Nicolaides | 257/3 |
| 4,092,060 | A | 5/1978 | Nunoshita et al. | 385/7 |
| 4,545,111 | A | 10/1985 | Johnson | 438/6 |
| 4,782,340 | A | 11/1988 | Czubatyj et al. | 345/92 |
| 5,296,716 | A | 3/1994 | Ovshinsky et al. | 257/3 |
| 6,391,688 | B1 | 5/2002 | Gonzalez et al. | 438/128 |
| 6,730,928 | B2 * | 5/2004 | Wyeth et al. | 257/3 |
| 6,828,884 | B2 * | 12/2004 | Wyeth et al. | 333/262 |
| 6,903,362 | B2 * | 6/2005 | Wyeth et al. | 257/3 |
| 6,956,451 | B2 * | 10/2005 | Wyeth et al. | 333/262 |
| 7,046,106 | B2 * | 5/2006 | Wyeth et al. | 333/262 |
| 2003/0072195 | A1 | 4/2003 | Mikolajick | 365/200 |

* cited by examiner

*Primary Examiner*—Dean Takaoka
(74) *Attorney, Agent, or Firm*—Kilpatrick Stockton LLP

(57) ABSTRACT

A circuit for guiding electromagnetic waves includes a substrate for supporting components of the circuit. The circuit includes a control device which includes a first conductive element on the substrate for connection to a first component of the circuit and a second conductive element on the substrate for connection to a second component. The control device is made up of a variable impedance switching material on the substrate which exhibits a bi-stable phase behavior. The compound has a variable impedance between a first impedance state value and a second impedance state value which can be varied by application of energy thereto to thereby affect the amplitude or phase delay of electromagnetic waves through the circuit.

18 Claims, 11 Drawing Sheets

PHASE CHANGE CONTROL DEVICES AND CIRCUITS FOR GUIDING ELECTROMAGNETIC WAVES EMPLOYING PHASE CHANGE CONTROL DEVICES

CROSS REFERENCE TO REATED APPLICATIONS

This application is a continuation of application of application Ser. No. 11/246,233 entitled PHASE CHANGE CONTROL DEVICES AND CIRCUITS FOR GUIDING ELECTROMAGNETIC WAVES EMPLOYING PHASE CHANGE CONTROL DEVICES, which was filed on Oct. 11, 2005, now U.S. Pat. No. 7,046,106, which is continuation of application Ser. No. 10/980,601, which issued as U.S. Pat. No. 6,956,451, entitled PHASE CHANGE CONTROL DEVICES AND CIRCUITS FOR GUIDING ELECTROMAGNETIC WAVES EMPLOYING PHASE CHANGE CONTROL DEVICES, which was filed on Nov. 4, 2004 and is incorporated herein by reference in its entirety, and claims priority to the filing date thereof, which is a continuation of application Ser. No. 10/346,551, which issued as U.S. Pat. No. 6,828,884, entitled PHASE CHANGE CONTROL DEVICES AND CIRCUITS FOR GUIDING ELECTROMAGNETIC WAVES EMPLOYING PHASE CHANGE CONTROL DEVICES, which was filed on Jan. 17, 2003 and is incorporated herein by reference in its entirety, and claims priority to the filing date thereof, which is a continuation in part of application Ser. No. 09/851,619,which issued as U.S. Pat. No. 6,730,928, entitled Phase Change Switches and Circuits Coupling to Electromagnetic Waves Containing Phase Change Switches, which was filed on May 9, 2001, and claims priority to the filing date thereof, the disclosure of which is expressly incorporated by reference herein.

BACKGROUND OF THE INVENTION

1. Field of the Invention

The invention relates to phase change switches and other control elements or devices, and more particularly, to phase change switches or control devices having a dynamic range of impedance, and circuits and components employing such switches or control devices. More specifically, the invention relates to such switches which can be employed in circuits such as on frequency selective surface arrays, for controlling current flow throughout the array, through the use of the switches. By controlling such current flow, the properties of the frequency selective surface array can be actively controlled. In addition, the invention also relates to implementation of such switches and other control devices in circuits, and the circuits themselves, that use conductive structures and dielectrics to guide electromagnetic (EM) waves.

2. Background of the Invention

Mechanical on/off switches have been used in circuits designed to interact with electromagnetic waves, and in particular, circuits designed to handle guided electromagnetic (EM) waves. Another set of such applications includes two-dimensional periodic arrays of patch or aperture elements known as frequency selective surfaces (FSS), the capabilities of which have been extended by addition of active devices, such as switches, and which are generally known as active grid arrays.

The mechanical process in these on/off switches involves the physical motion of a conductor (the "bridge") between two positions, i.e., one where the bridge touches another conductor and completes the direct current (DC) conducting path of the circuit ("closed") or moves close enough to it that the capacitive impedance is low enough to complete the path for alternating current (AC) flow, and the other where it has moved away from the contact ("open") to break the DC conducting circuit path or to raise the capacitive impedance to block AC flow. Such mechanical switches have been made at micrometer size scale in so-called MEMS—Micro-Electro Mechanical Systems. MEMS switch technology to date has shown poor lifetimes and packaging costs.

A key goal in the use of MEMS switches with guided EM waves in the so-called radio frequency (RF) bands is to provide controllable phase delays in a circuit. This is done by using a set of switches to introduce combinations of fixed length phase delay branches into a circuit path. The degree of phase delay control is related to how many separate branches (and switches to control them) are added to the circuit. The switching in or out of a given fixed delay branch provides a step change in the net circuit phase delay. In this approach, if finer steps are desired to cover the same range of total phase delay, then more branches and switches are required.

Alternatively, transistor and transistor-like semiconductor switching devices have been used in circuits designed to interact with electromagnetic waves and in particular, in circuits and components thereof that guide EM waves. Such devices which include PIN diodes and field effect transistors (FETs) form the basis of a collection of solid-state circuits operating on guided EM waves of up to gigahertz (e.g., GHz, 1 GHz≅$10^9$ Hz) for use in microwave and communication systems. However, for the specific applications herein, the semiconductor switching devices typically have shortcomings in several areas, i.e., GHz and above. Such shortcomings may include high switching power required or high insertion losses.

In the field of semiconductor memory devices, it has been proposed to use a reversible structural phase change (from amorphous to crystalline phase) thin-film chalcogenide alloy material as a data storage mechanism and memory applications. A small volume of alloy in each memory cell acts as a fast programmable resistor, switching between high and low resistance states. The phase state of the alloy material is switched by application of a current pulse, and switching times are in the nanosecond range. The cell is bi-stable, i.e., it remains (with no application of signal or energy required) in the last state into which it was switched until the next current pulse of sufficient magnitude is applied.

SUMMARY OF THE INVENTION

In accordance with one aspect of the invention there is provided a switch or control element or device for use in circuits and components that interact with electromagnetic radiation, and more specifically, in circuits or components that guide EM waves. The switch or control element or device includes a substrate for supporting components of the switch. A first conductive element is on the substrate for connection to a first component of the circuit or component (hereafter collectively "circuit"), and a second conductive element is also provided on the substrate for connection to a second component of the circuit. Such switches and circuits involve implementations to guide EM waves in circuits such as parallel wire transmission lines, coaxial cables, waveguides, coplanar waveguides, striplines and microstriplines. Use of such switch devices allows control of energy flow through the circuits with functional properties such as fast switching times, e.g, about 10 nanoseconds to about 1 microsecond; low insertion loss, e.g., about 1 dB or less; high isolation, e.g., about 20 dB or higher; long lifetime, e.g., at least about $10^{13}$ cycles; and low cost. Addressing of the control devices either electrically or optically allows flexibility in how the devices are used.

A circuit for guiding electromagnetic waves includes a substrate for supporting components of the circuit for guiding the electromagnetic waves and at least one control device. The control device includes at least one conductive element on the substrate for connection to at least one component of the circuit. A second conductive element is provided on the substrate for connection to at least one second component of the circuit and the control device is made up of a variable impedance switching material on the substrate. The switching material connects the at least one first conductive element to the at least one second conductive element. The switching material is made up of a compound which exhibits a bi-stable phase behavior, and is variably switchable to an impedance between the first impedance state value and up to a second impedance state value by application of energy thereto. As a result, the switching affects the amplitude and/or phase delay of electromagnetic waves through the circuit as a result of a change in the impedance value of the compound. Similarly, the path of the guided EM waves can also be affected and/or controlled.

In more specific aspects, the first and second impedance state values are such that at one value the control device is conductive, and at the other value the control device is less conductive or non-conductive. Preferably an energy source is connected to the control device for causing the change in impedance value. The energy source can be an electrical energy source with leads connected to the switch. Alternatively, the energy source could be a light source which is a laser positioned to direct a laser beam to the switch or control device to cause the change in impedance value. In a more specific aspect, fiber optics or an optical waveguide is associated with the laser and the switch to direct the laser light to the switch.

The circuit and components can be a circuit or component employing or made up as parallel wire transmission lines, coaxial cables, waveguides, coplanar waveguides, striplines, or microstriplines. The material making up the switch or control device is preferably a chalcogenide alloy, and more preferably at least one of $Ge_{22}Sb_{22}Te_{56}$, and AgInSbTe.

In a more preferred aspect, in some applications, the compounds for the control device are used in a range of stable intermediate stage set on a submicron scale or mixtures of amorphous and crystalline phases, but which exhibit (average) intermediate properties under larger scale measurement or functional conditions.

In an alternative aspect, the invention is directed to a control device for use in circuits which guide electromagnetic waves. The control device is made up as previously described herein.

BRIEF DESCRIPTION OF THE DRAWINGS

Having thus briefly described the invention, the same will become better understood from the following detailed discussion, made with reference to the appended drawings wherein.

DETAILED DESCRIPTION OF THE INVENTION

Figure 1:
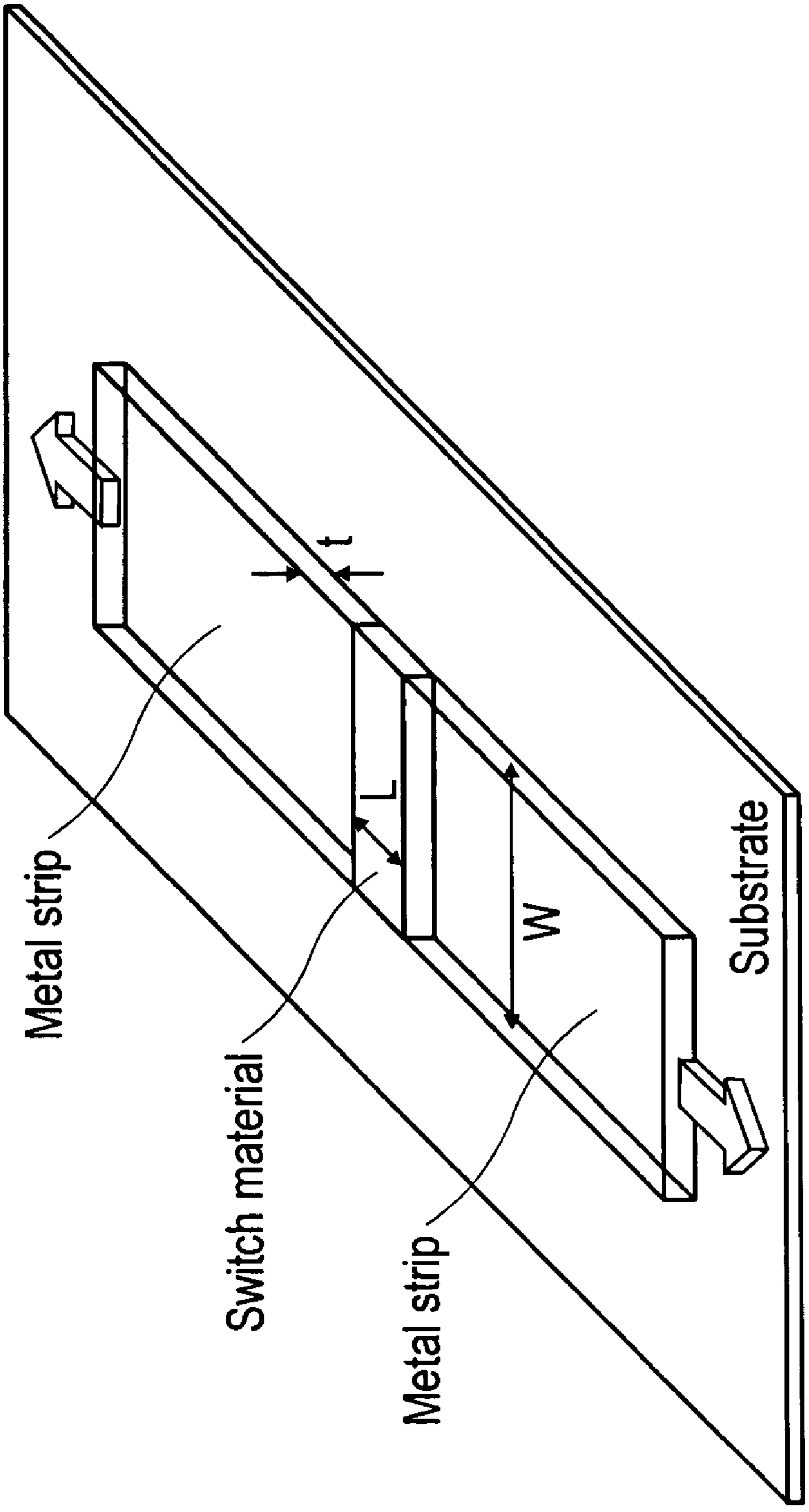
FIG. 1 is a schematic view of the control device between two conductive elements as described herein.

FIG. 1 schematically illustrates a switch 11 in accordance with one aspect of the invention. The control device includes a substrate 13 having a variable impedance switch material 15 deposited thereon to form a control device element, and connecting a first conductive element 17, typically a metal strip, to a second conductive element 19. In this embodiment, the conductive elements 17 and 19 can be, for example, two circuit paths of an array or circuit such as a frequency selective surface array. The entire array can sit on top of a dielectric substrate 13, such as polyethylene.

The switch material 15 is typically a reversible phase change thin film material having a dynamic range of resistivity or impedance. An example of a typical switch material for use in accordance with the invention is a chalcogenide alloy, more specifically, $Ge_{22}Sb_{22}Te_{56}$. Although a specific alloy has been described, it will be readily apparent to those of ordinary skill in the art that other equivalent alloys providing the same functionality may be employed. Other such phase change alloys include the AgInSbTe (AIST), GeInSbTe (GIST), (GeSn)SbTe, GeSb(SeTe), and $Te_{51}Ge_{15}Sb_2S_2$ quaternary systems; the ternaries $Ge_2Sb_2Te_5$, InSbTe, GaSeTe, $SnSb_2Te_4$, and InSbGe; and the binaries GaSb, InSb, InSe, $Sb_2Te_3$, and GeTe. As already noted, several of these alloys are in commercial use in optical data storage disk products such as CD-RW, DVD-RW, PD, and DVD-RAM. However, there has been no use or suggestion of use of such an alloy as a control element in applications such as described herein. Typically, the alloy is deposited by evaporation or sputtering in a layer that is typically 20-30 nm thick to a tolerance of ±1 nm or less as part of a large volume, conventional, and well known to those of ordinary skill in the art, manufacturing process.

Figure 6:
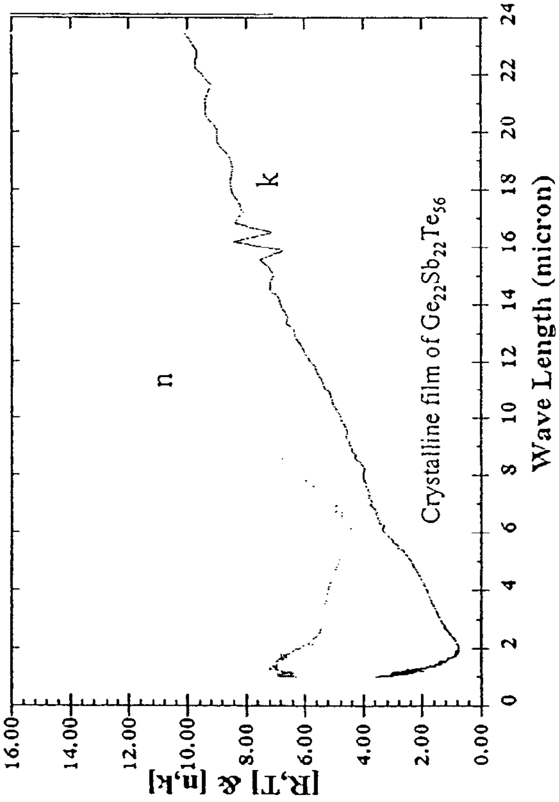
FIGS. 6 and 7 are graphs illustrating measured values of the complex index of refraction of an alloy used in the control device, in the infrared for the crystalline phase, and the amorphous phase.
Figure 7:
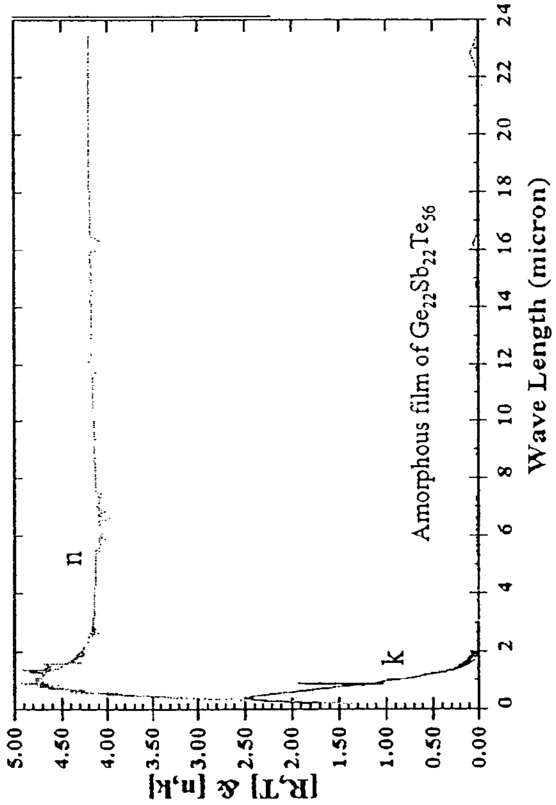

In this regard, with reference to the specific alloy discussed, FIGS. 6 and 7 illustrate measured values of the complex index of refraction of $Ge_{22}Sb_{22}Te_{56}$ over a spectral wavelength range that includes 8-12 μm. At the mid-band wavelength of 10 μm, the real index, n, changes by a factor of 2 between the two phases, but the so-called extinction coefficient, k, goes from approximately 4.8 in the crystalline phase to near zero in the amorphous phase.

Accordingly, the following table shows calculations using this data to find the changes in resistivity (ρ) and dielectric constant (ε) of the material.

Optical and Electrical Properties of the alloy $Ge_{22}Sb_{22}Te_{56}$ at IR vacuum wavelength of 10 μm.

| | Phase | |
|---|---|---|
| | Crystalline | Amorphous |
| n | | 4.2 |
| k | 4.8 | 0.01 |
| f (frequency in Hz) | $3 \times 10^{13}$ | $3 \times 10^{13}$ |
| $\rho \propto (nkf)^{-1}$ (ohm-cm) | $7.6 \times 10^{-4}$ | 0.71 |
| $\epsilon = n^2 - k^2$ | 44.2 | 17.6 |

As the table shows, the change in k correlates with a change in resistivity of almost three orders of magnitude.

In order to determine the thermal IR (infrared) performance, the shunt is modeled as a capacitor and a resistor in parallel. The following table shows the calculated values for the capacitive and resistive impedance components with switch dimensions in the expected fabrication range, using the expressions shown in the table.

Resistance (R) and capacitive reactance ($X_C$) components of the switch impedance in the crystalline and amorphous states for several representative values of the switch dimensions shown in FIG. 1. The capacitive reactance values are calculated using $\omega = 1.9 \times 10^{14}$ Hz, which corresponds to f = 30 THz or λ = 10 μm.

| | | | Crystalline | | Amorphous | |
|---|---|---|---|---|---|---|
| L (μm) | W (μm) | t (μm) | $X_C = (\omega C)^{-1}$ with $C = \epsilon Wt/L$ (ohms) | $R = \rho L/Wt$ (ohms) | $X_C = (\omega C)^{-1}$ with $C = \epsilon Wt/L$ (ohms) | $R = \rho L/Wt$ (ohms) |
| 1.0 | 1.0 | 0.01 | 1.36K | 1K | 3.4K | 1M |
| 1.0 | 1.0 | 0.1 | 136 | 100 | 340 | 100K |
| 1.0 | 1.0 | 0.2 | 68 | 50 | 170 | 50K |
| 1.0 | 0.5 | 0.1 | 271 | 200 | 680 | 200K |

Figure 8:
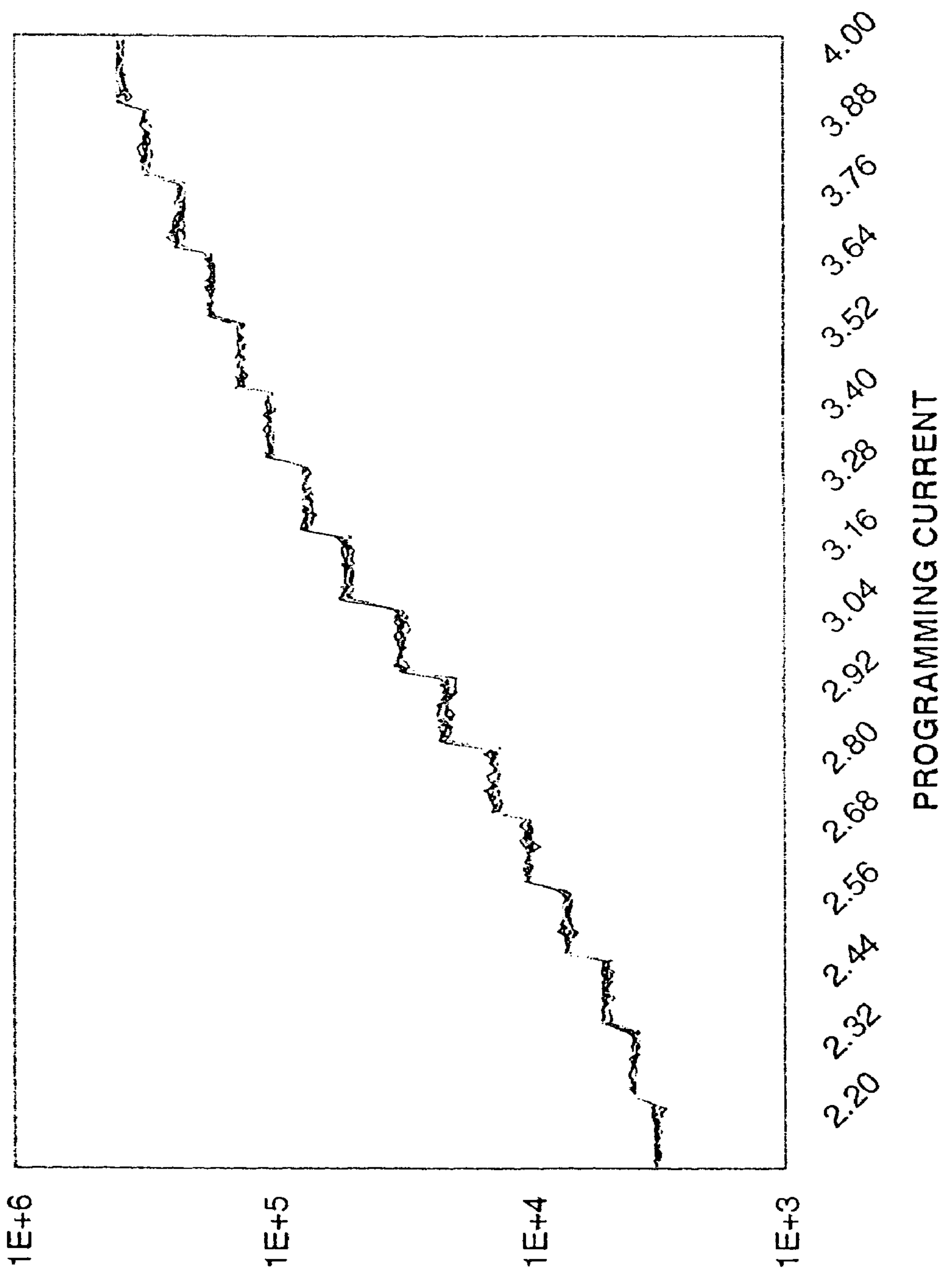
FIG. 8 is a graph illustrating how the resistance of the phase change alloy can be continuously varied to provide reflectivity/transmissivity control in a circuit.
Figure 9:
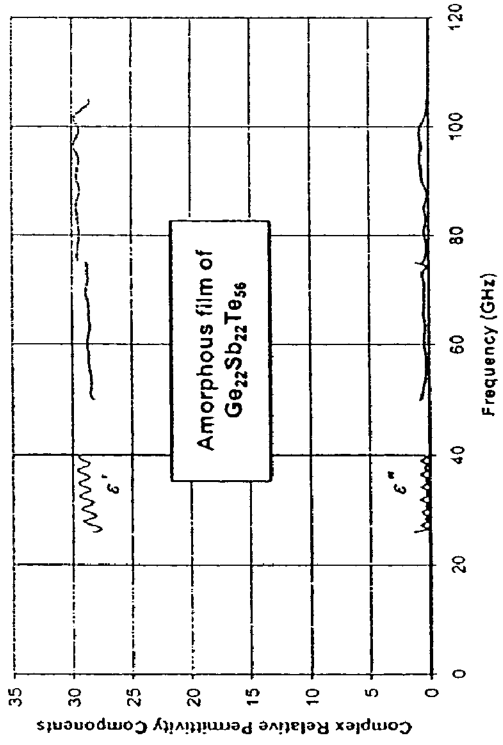
FIGS. 9-12 are graphs illustrating measurement result for the complex relative permittivity component magnitudes for $Ge_{22}Sb_{22}Te_{56}$ (GST-225or GST) and AgInSbTe (AIST) phase change material over a frequency range of 26-105 GHz.
Figure 10:
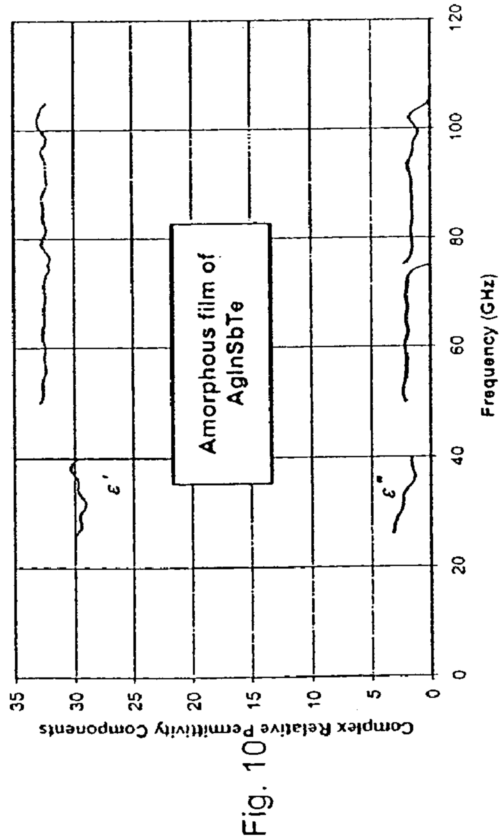
Figure 11:
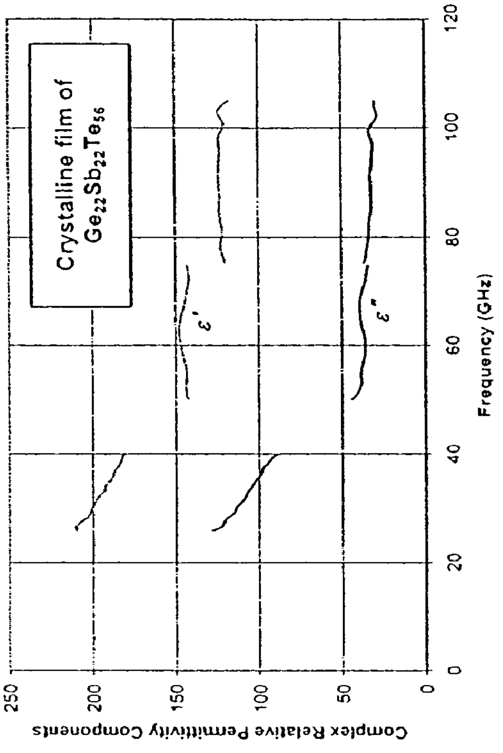
Figure 12:
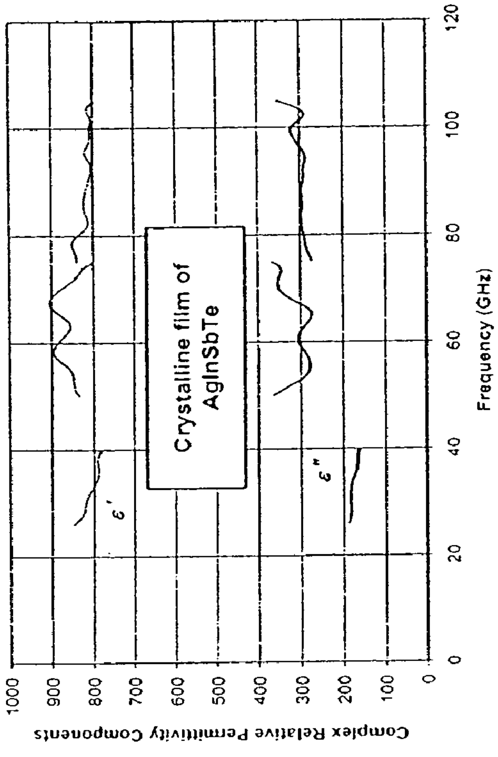

As further shown in FIG. 8, the resistance of the specific alloy discussed herein can therefore be continuously varied to provide reflectivity control.

Figure 2:
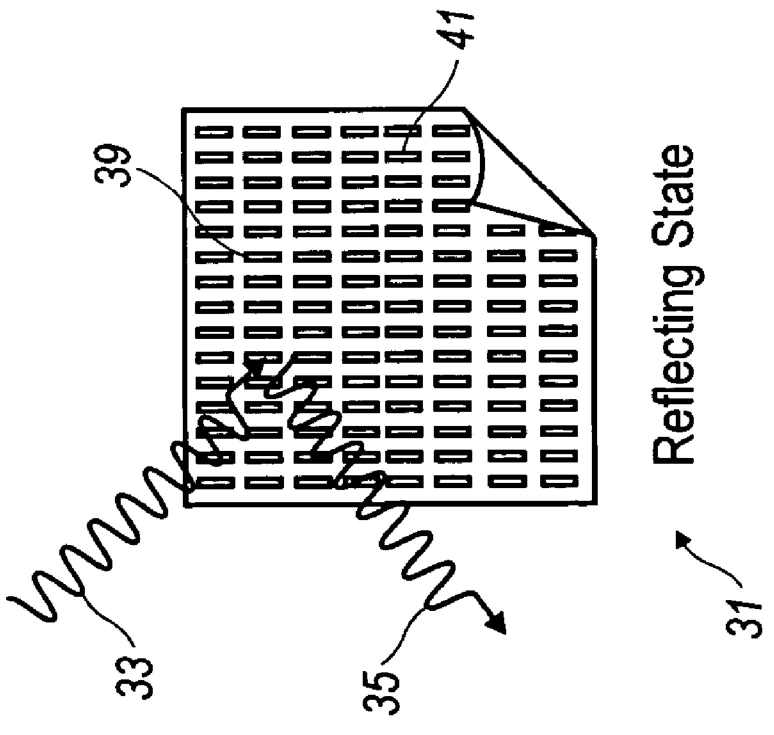
FIGS. 2 and 3 are schematic views of a frequency selective surface array shown, respectively, in a reflecting state and in a non-reflecting state, depending on the impedance value of control devices disposed throughout the array.
Figure 3:
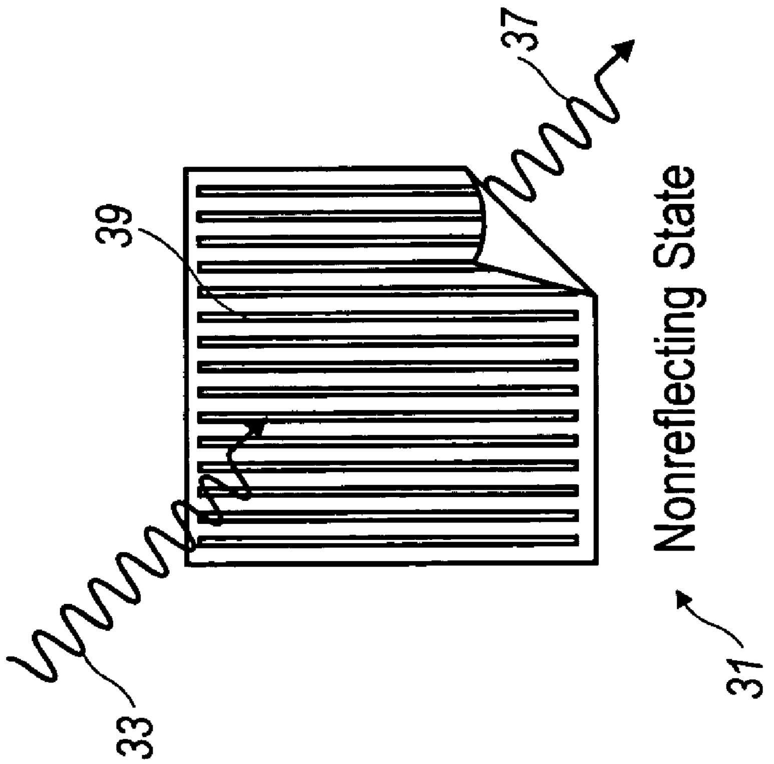

FIGS. 2 and 3 thus show the effect on an array of the use of control devices 11. This is shown, for example, in a frequency selective surface array 31. In the case of FIG. 2, the array includes a plurality of conductors 39 having control devices 41 as described herein interconnected therebetween. In the case of FIG. 2, the control devices are in a high impedance state, thereby interrupting the conductive paths such that electromagnetic radiation 33 impinging on the array then becomes reflected radiation 35. Conversely, FIG. 3 shows the array with the control devices at a low impedance such that the conductors 39 are continuous, and the impinging radiation 33 passes through the array 31 as transmitted radiation 37.

Figure 4:
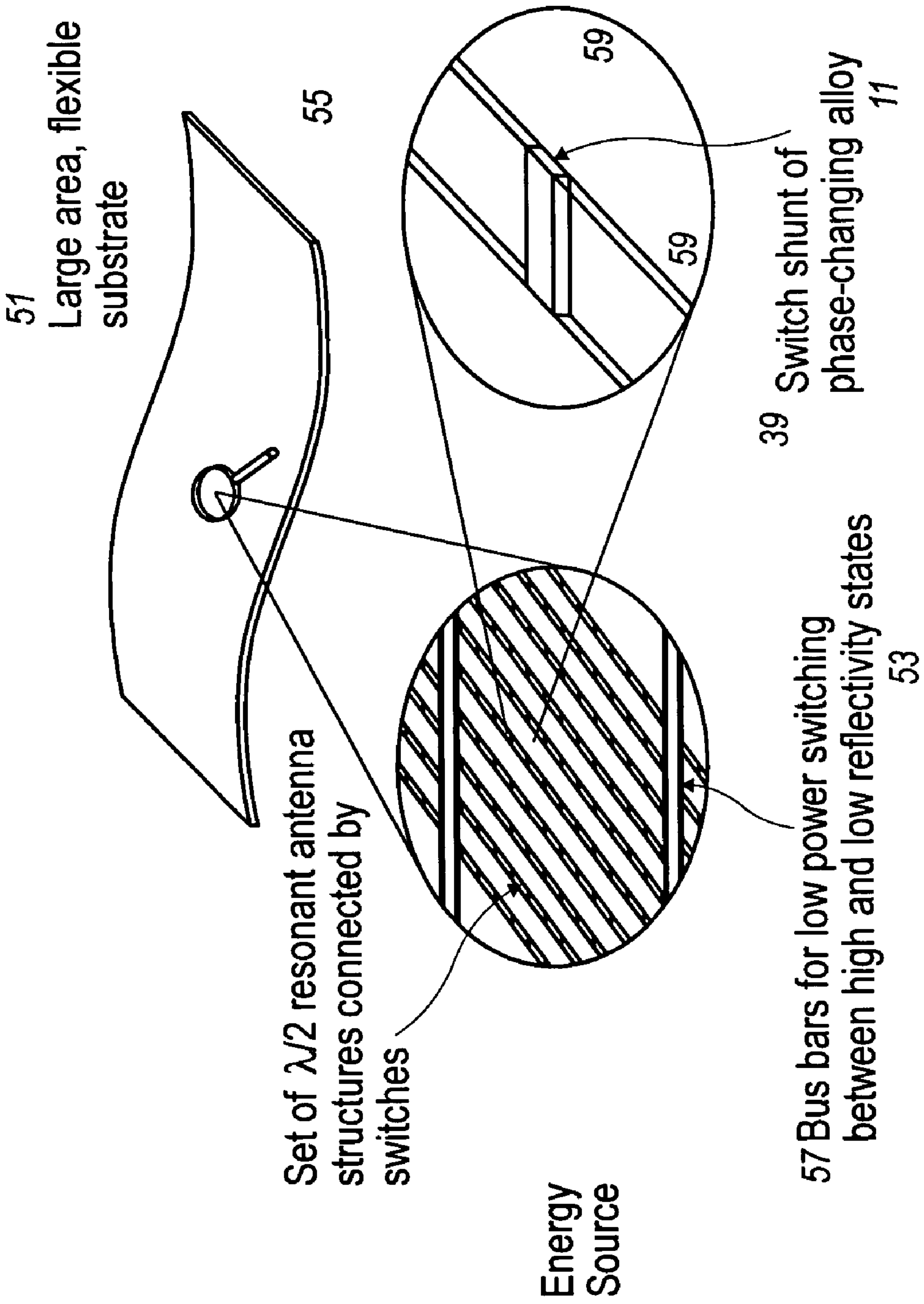
FIG. 4 shows three views of increasing magnification of an array, with conductive elements and control devices arranged therein, and with a further magnified view of a typical switch control device.

FIG. 4 illustrates in greater detail a typical circuit 51, which as illustrated in the intermediate magnification 53, includes a plurality of conductors 39 having the switches shown as dots interconnected therebetween. In order to vary the impedance of the switches, an energy source 57 may be connected to the individual conductors to provide current flow to the control devices 11 to thereby change the impedance of the control devices 11 by the application of energy, in the form of electricity. As further shown in the third magnification 55, while the conductors 39 themselves can be directly connected to an energy source, it is also possible to selectively establish leads 59 to the switch material 15 to apply energy to the switch material directly and not through the conductors 39 to cause the impedance to vary.

Figure 5:
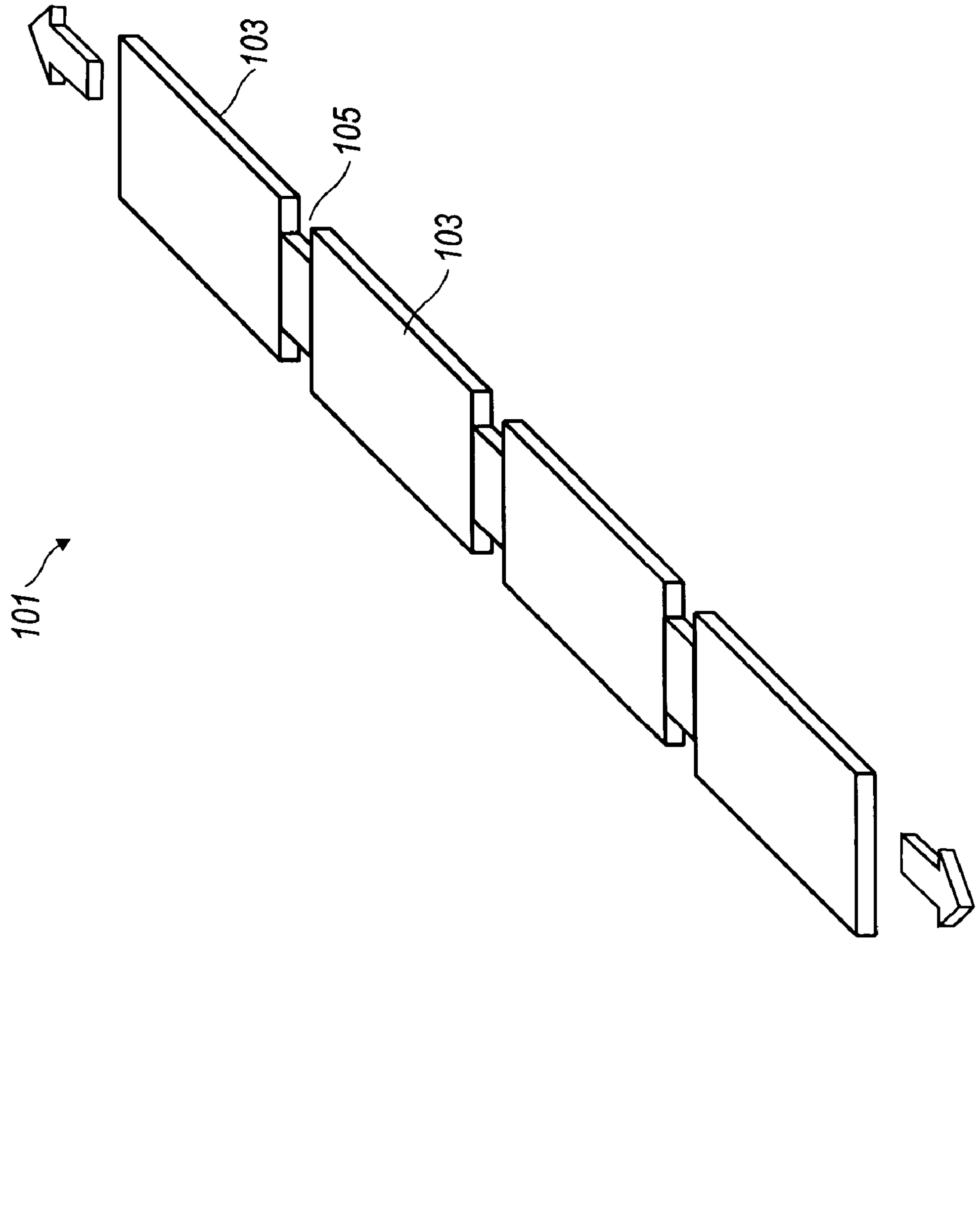
FIG. 5 is a schematic view of a circuit element similar to that of FIG. 1, for use in a switching frequency selective surface array (as in FIGS. 2, 3, and 4), where the entire element is made of switchable material but configured so that only the connecting elements change state upon application of electrical energy.

FIG. 5 shows in detail an additional embodiment 101 of the invention in which conductive elements 103 and the connecting control device 105 are entirely made of the same phase change material to form the control device element as compared to the embodiment of FIG. 1. In this embodiment, the control device 105 is purposely made less wide to form a switch element which is narrower than the conductive elements 103 that connect to it on either side, but having a thickness equal to the conductive elements 103. In this case, the cross section of the control device element is less than the cross section of the conductive elements 103, causing the electrical resistance per unit length to be greater in the control device element than in the conducting elements. When electrical current is passed through a circuit made up of a series of these constricted switch connections, i.e., control devices 105, the phase change material in the control devices 105 will dissipate more electrical energy per unit length than the conducting elements because of the higher resistance per unit length. This higher dissipation will cause the control devices 105 to experience a greater temperature rise than the conductive elements 103. Therefore a correctly sized electrical current pulse will cause the phase change material in the control devices 105 to change state while the phase change material in the conductive elements 103 remains in the low impedance state. As is the case with the earlier described embodiment as shown in FIG. 4, the leads 59 (not shown) can also be established to connect to the control devices 105 to apply energy directly to the control device 105, and not through the conductive elements 103.

Figure 16:
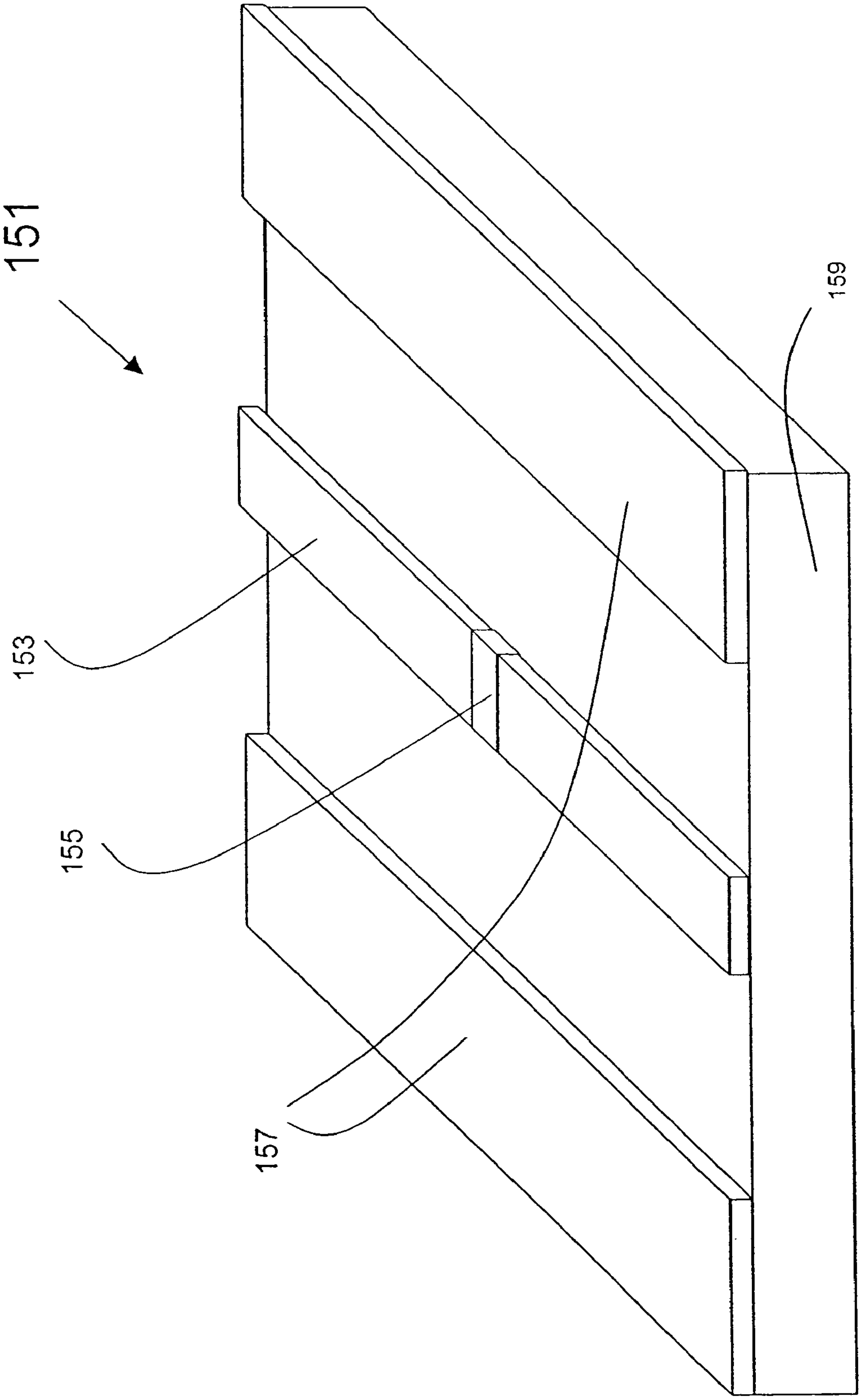
FIG. 16 is a perspective view illustrating the use of phase change material to produce variable impedance switching action in a dual stripline arrangement, and further illustrating how a separate energy source might be coupled directly to the control device to effect switching thereof.

While in a specific embodiment the impedance of the phase change material of control devices is varied by application of electrical current to change the state of the phase change material, it will be appreciated by those of ordinary skill in the art that given the nature of the material, other energy sources can be employed. For example, selectively targeted laser beams may be directed at the control devices to change the overall circuit current flow configuration, as well as other alternative means of providing energy to change the state and thus vary the impedance can be used. The laser beam can be directed through free space or can be directed through fiber optics or optical waveguide directly onto the control device as, for example, is schematically illustrated in FIG. 16 for a different embodiment application.

As already discussed, in its various aspects the invention uses the changing properties of a specific type of metallic alloy. The alloys, as already noted, among others can include the compounds GST-225, GST, or AIST. The amount of energy needed to cause transition in alloy volumes on the order of 1 $\mu m^3$ is in the range of about 1 to about 3 nanojoules for known materials depending on the thermal dissipation environment of the alloy volume. The energy can be supplied to the material, as already noted, in various ways including exposure to pulse, focused laser beams or application of a pulse of electrical current. The two phases, crystalline and amorphous, have different electromagnetic properties across a significant part of the electromagnetic spectrum.

FIGS. 9-12 show the measured magnitude of the real and imaginary components ($\epsilon'$ and $\epsilon''$ respectively) of the complex (relative, i.e., normalized to $\epsilon_0$) dielectric constant of the alloy GST over a range of RF electromagnetic frequency from about 26 GHz up to about 105 GHz for both phases, and show similar data for the alloy AIST.

As the figures show, at a frequency of 50 GHz, for example, the real dielectric constant, $\epsilon'$, changes by a factor of 5 between the two GST phases, and by a factor of approximately 25 between the two IST phases. However, the imaginary dielectric constant magnitude, $\epsilon''$, which is related to the conductivity of the material goes from approximately 45 (at 50 GHz) in the GST crystalline phase to less than one in the GST amorphous phase. The corresponding change for $\epsilon''$ of AIST at 50 GHz is from about 350 to about 2.5.

Figure 13:
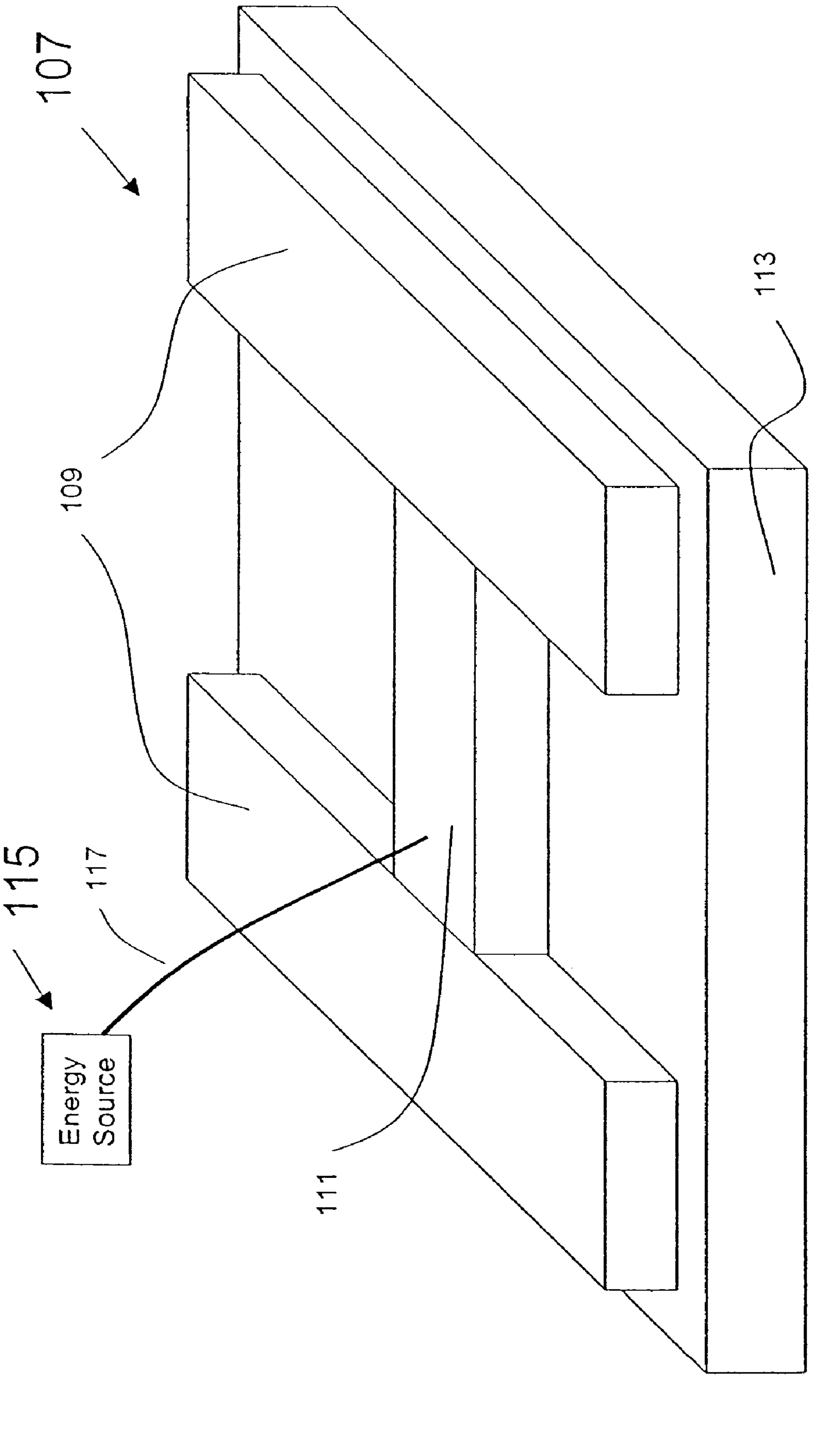
FIG. 13 is a top view of conductor layers and phase change material layer on a dielectric substrate of a guided wave device assembled as a coupled stripline.

FIG. 13 shows a schematic depiction of a partial embodiment of the invention in which the phase change material is placed between two metallic conductors 109 as a part of a structure 107, for example, an electromagnetic (EM) wave guiding structure. In this embodiment, the structure 107 is a dual stripline structure which guides EM waves in a manner well known to those of ordinary skill in this art. Based on the known properties of the phase change material, the change in the lumped impedance of the material can be estimated as the material changes from crystalline to amorphous phase. For the GST material at 50 GHz, the resistive (real) impedance, which scales inversely with $\epsilon''$, will increase by a factor of over 50 as the material changes from crystalline to amorphous, while the capacitive (imaginary) impedance, which scales inversely with $\epsilon'$, will increase by a factor of approximately eight (8) at the same time. Similarly, for the AIST material at 50 GHz, the resistive (real) impedance will increase by a factor of approximately 140 as the material changes from crystalline to amorphous, while the capacitive (imaginary) impedance will increase by a factor of about 25 at the same time. Without predicting exact effects in a specific embodiment, it will be readily apparent to those of ordinary skill in the art that this level of change in lumped impedance components is sufficiently large to design devices to produce significant control effects in wave guiding structures. In the case of the dual stripline structure of FIG. 13, the components are arranged on a dielectric substrate 113 to guide the electromagnetic waves in desired paths.

In a more specific embodiment as schematically illustrated in FIG. 13, an energy source 115 can be coupled through a direct connection 117 to the control device 111 to effect the change in impedance. The energy source can be an electrical source 115 coupled through a lead or leads 117 to the switch material 111, or alternatively, can be a laser coupled through a fiber optic fiber to the switch material. As already previously noted, the laser can alternatively also be free standing and the laser beam directed in free space to the control device or switch material to provide the necessary energy to change the state thereof.

Figure 14:
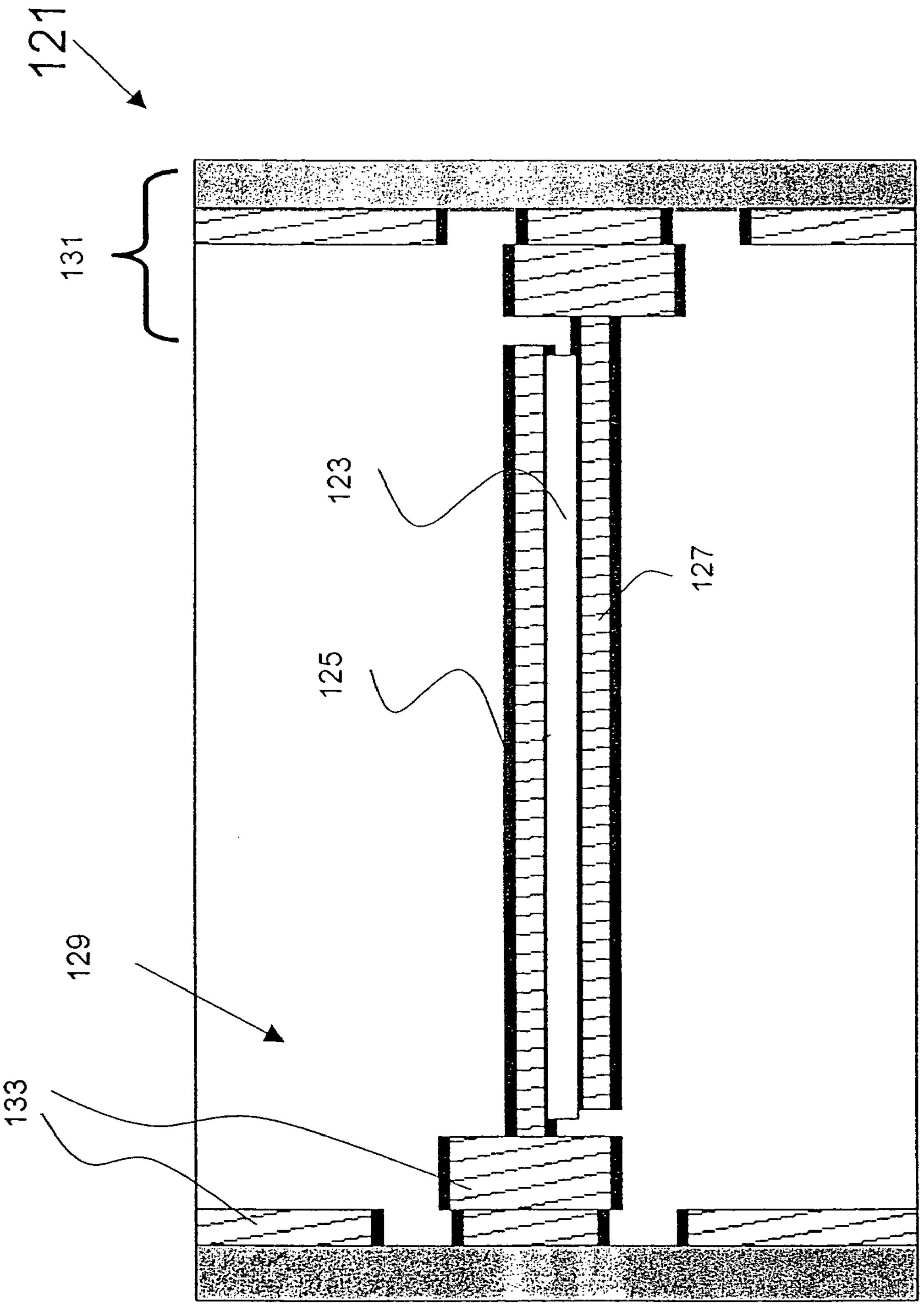
FIG. 14 is a top view of conductor layers and phase change material layer on a dielectric substrate of a guided wave device arranged as a coplanar waveguide.

FIG. 14 illustrates yet still another embodiment of an implementation of the invention described herein in which the guided wave device is a coupled stripline 121. The phase change material 123 is arranged between conductors 125 and 127 of the coupled stripline 121 structure which are respectively connected at each end through conductor layers 133 making up a part of a coplanar waveguide termination 131.

Figure 15:
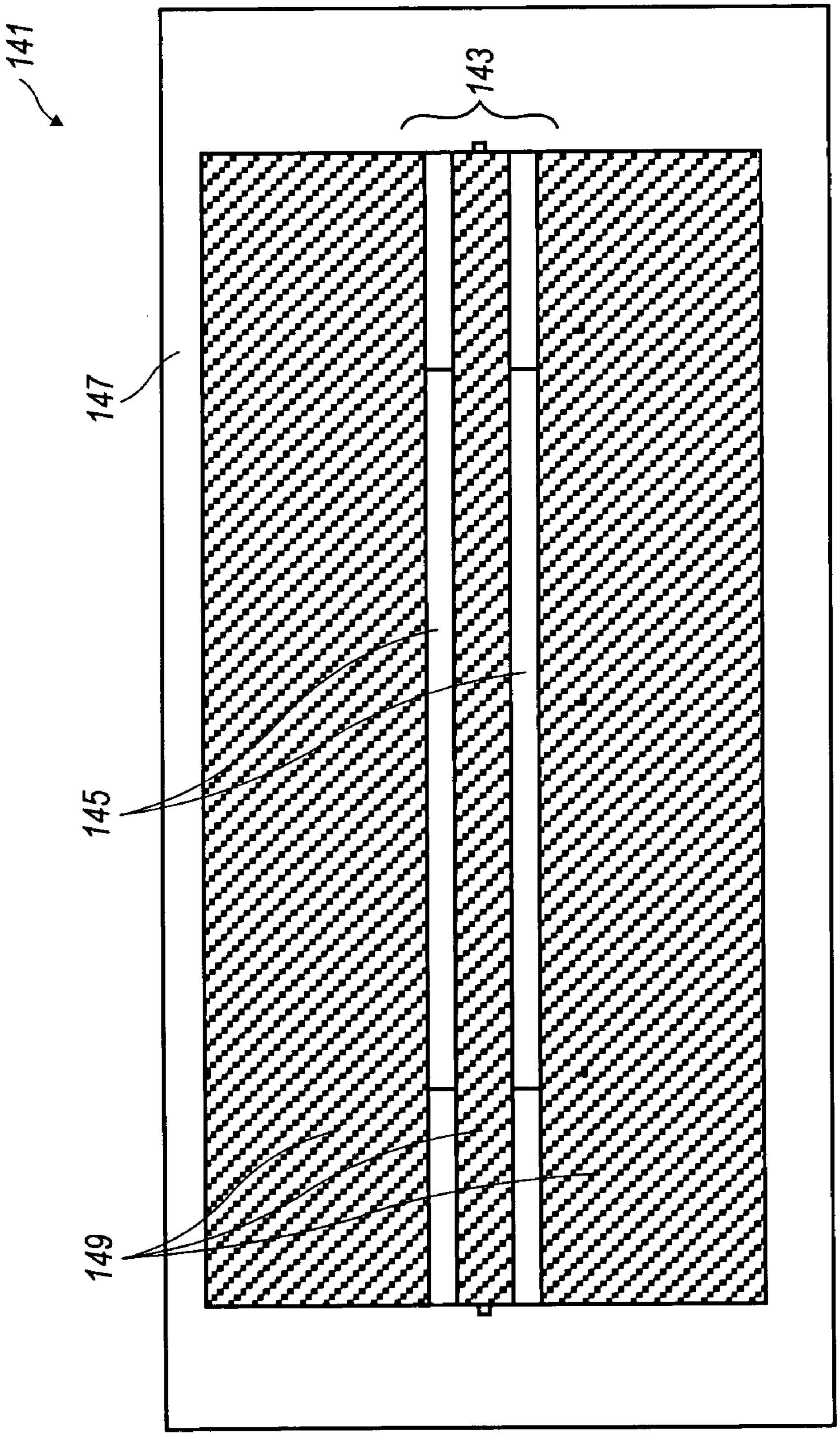
FIG. 15 is a perspective view of an alternative design for using phase change material to produce variable impedance switching action in a coplanar waveguide structure.

In a yet still further embodiment, FIG. 15 illustrates an implementation of the control device in a guided wave device made up as a coplanar waveguide 141. The coplanar components 143 are arranged adjacent to each other and include the phase change material 145 arranged between conductor layer 149 on a dielectric substrate 147.

In a final embodiment described herein as shown in FIG. 16, the guided wave device is a coplanar waveguide structure 151 which includes a metal center conductor 153 with the phase change material or control device 155 arranged as an insert. The device 151 also includes parallel metal ground planes 157 arranged on a dielectric substrate 159.

As may be appreciated from the table in FIG. 8, in these types of guided wave devices such as shown in FIGS. 13-16, the variable impedance carries with it a variation of the phase delay in the guided wave, as will be readily apparent to those of ordinary skill. Thus, the guided wave devices can be employed as variable phase delay devices.

Having thus described the invention in detail, the same will become better understood from the appended claims in which it is set forth in a non-limiting manner.

The invention claimed is:

1. A switching circuit for coupling to electromagnetic waves comprising:

a substrate;

a first subcircuit on said substrate capable of electrical connection to a switchable material; and a second subcircuit on said substrate capable of electrical connection to the switchable material;

the switchable material exhibiting a range of impedance state values in response to changes in the electrical connection with the first and second subcircuits, such that the switchable material controllably transmits or reflects at least some portion of impinging electromagnetic radiation in response to changes in the impedance state value.

2. The circuit of claim 1, wherein the range of impedance state values includes a first value that renders the switchable material conductive, and a second value that renders the switchable material non-conductive.

3. The circuit of claim 1, further comprising an energy source connected to the first subcircuit and the second subcircuit for causing changes in the electrical connection.

4. The circuit of claim 1, wherein said switchable material is a reversible phase change material having a variable impedance over a specified range which is dependent on the electrical connection.

5. The circuit of claim 1, wherein said first and second subcircuits are the same material as said switchable material.

6. The circuit of claim 5, wherein the switchable material is formed so as to exhibit a second impedance state in response to the electrical connection while the first and second subcircuits remain in a first impedance state.

7. The circuit of claim 6, wherein the switchable material is narrower than the first and second subcircuits.

8. The circuit of claim 1, wherein the switchable material comprises chalcogenide alloy.

9. The circuit of claim 1, wherein the switchable material comprises $Ge_{22}$ $Sb_{22}$ $Te_{56}$.

10. An array of switching circuits comprising:

multiple switching circuits, each of said multiple switching circuits including, a first subcircuit on said substrate capable of electrical connection to a switchable material; and a second subcircuit on said substrate capable of electrical connection to the switchable material;

the switchable material exhibiting a range of impedance state values in response to changes in the electrical connection with the first and second subcircuits, such that the switchable material controllably transmits or reflects at least some portion of impinging electromagnetic radiation in response to changes in the impedance state value.

11. The array of claim 10, wherein the range of impedance state values includes a first value that renders the switchable material conductive, and a second value that renders the switchable material non-conductive.

12. The array of claim 10, further comprising an energy source connected to the first subcircuit and the second subcircuit for causing changes in the electrical connection.

13. The array of claim 10, wherein said switchable material is a reversible phase change material having a variable impedance over a specified range which is dependent on the electrical connection.

14. The array of claim 10, wherein said first and second subcircuits are the same material as said switchable material.

15. The array of claim 14, wherein the switchable material is formed so as to exhibit a second impedance state in response to the electrical connection while the first and second subcircuits remain in a first impedance state.

16. The array of claim 15, wherein the switchable material is narrower than the first and second subcircuits.

17. The array of claim 10, wherein the switchable material comprises chalcogenide alloy.

18. The array of claim 10, wherein the switchable material comprises $Ge_{22}$ $Sb_{22}$ $Te_{56}$.

* * * * *